(12) United States Patent
Nakajima et al.

(10) Patent No.: US 10,427,885 B2
(45) Date of Patent: Oct. 1, 2019

(54) ARTICLE SUPPLY METHOD AND DEVICE

(71) Applicant: Kurashiki Boseki Kabushiki Kaisha, Okayama (JP)

(72) Inventors: Daisuke Nakajima, Osaka (JP); Hideaki Hikawa, Osaka (JP)

(73) Assignee: Kurashiki Boseki Kabushiki Kaisha, Obayama (JP)

( * ) Notice: Subject to any disclaimer, the term of this patent is extended or adjusted under 35 U.S.C. 154(b) by 0 days.

(21) Appl. No.: 16/066,666

(22) PCT Filed: Nov. 30, 2016

(86) PCT No.: PCT/JP2016/085494
§ 371 (c)(1),
(2) Date: Jun. 27, 2018

(87) PCT Pub. No.: WO2017/115600
PCT Pub. Date: Jul. 6, 2017

(65) Prior Publication Data
US 2019/0016540 A1     Jan. 17, 2019

(30) Foreign Application Priority Data
Dec. 28, 2015  (JP) ................................ 2015-257376

(51) Int. Cl.
*B65G 47/00* (2006.01)
*B65G 47/14* (2006.01)
(Continued)

(52) U.S. Cl.
CPC ......... *B65G 47/1407* (2013.01); *B65G 47/88* (2013.01); *H05K 13/028* (2013.01); *H05K 13/0409* (2018.08)

(58) Field of Classification Search
None
See application file for complete search history.

(56) References Cited

U.S. PATENT DOCUMENTS 4,460,108 A * 7/1984 Noda ................... H05K 13/028
221/181
5,950,801 A   9/1999 Vroomans
(Continued)

FOREIGN PATENT DOCUMENTS

JP   S54-155578    12/1979
JP   S61-217424     9/1986
(Continued)

OTHER PUBLICATIONS

"International Search Report (Form PCT/ISA/210) of PCT/JP2016/085494", dated Feb. 28, 2017, with English translation thereof, pp. 1-4.

*Primary Examiner* — Kavel Singh
(74) *Attorney, Agent, or Firm* — JCIPRNET

(57) ABSTRACT

This article supply method comprises: a step for introducing, using a movable block capable of reciprocating between a first position and a second position, a single object to be conveyed into a housing portion formed on the movable block when the movable block is in the first position; a forward step for pressing the movable block from the first position in a range of motion of the movable block while vacuum-sucking the movable block from the second position in the range of motion of the movable block, and then continuing the vacuum-sucking from the second position and moving the movable block to the second position; a step for discharging the object to be conveyed from the housing portion when the movable block is in the second position; and a return step for vacuum-sucking the movable block from the first position and moving the movable block to the first position.

8 Claims, 8 Drawing Sheets

(51) Int. Cl.
*B65G 47/88* (2006.01)
*H05K 13/04* (2006.01)
*H05K 13/02* (2006.01)

(56) References Cited

U.S. PATENT DOCUMENTS

| | | | |
|---|---|---|---|
| 6,443,669 B2 * | 9/2002 | Saito | H05K 13/021 198/390 |
| 6,726,408 B2 * | 4/2004 | McMahon | A44B 19/267 406/176 |
| 10,087,016 B2 * | 10/2018 | Nakajima | B65G 47/14 |
| 2018/0037418 A1 | 2/2018 | Nakajima et al. | |

FOREIGN PATENT DOCUMENTS

| | | |
|---|---|---|
| JP | S61-291317 | 12/1986 |
| JP | H10-294597 | 11/1998 |
| JP | 2000-504499 | 4/2000 |
| JP | 2013-001541 | 1/2013 |
| JP | 2016-164094 | 9/2016 |

* cited by examiner

ARTICLE SUPPLY METHOD AND DEVICE

CROSS-REFERENCE TO RELATED APPLICATION

This application is a 371 application of the International PCT application serial no. PCT/JP2016/085494, filed on Nov. 30, 2016, which claims the priority benefits of Japan Patent Application No. 2015-257376, filed on Dec. 28, 2015. The entirety of each of the above-mentioned patent applications is hereby incorporated by reference herein and made a part of this specification.

TECHNICAL FIELD

The present invention relates to a device and a method for conveying and supplying minute articles.

BACKGROUND ART

A so-called bulk feeder is used to convey and supply various electronic components or the like. For example, Patent Literature 1 describes a bulk feeder that sends rectangular chips randomly housed in a cassette into a tunnel (conveyance path) and conveys the chips by vacuum suction from an end portion side (downstream side) of the tunnel. The chips that have reached the end portion of the tunnel are sucked by a pickup nozzle to be sequentially taken out.

CITATION LIST

Patent Literature

Patent Literature 1: JP-A-10-294597

SUMMARY OF INVENTION

Technical Problem

However, studies by the present inventors have revealed that the conventional bulk feeder has a problem in improving supply speed. Reducing a take-out time interval (pitch) by the pickup nozzle increases the probability of failure in taking out the conveyed object. The reason of the problem is not in slow speed of the conveyance itself but in the interference of the subsequent conveyed object with the conveyed object to be taken out from a downstream end of the conveyance path. That is, the studies have shown that the conveyed objects aligned and conveyed in the conveyance path reach the downstream end one after another to form a line without gaps, causing the leading one conveyed object to be caught by the subsequent conveyed object to interrupt taking out the leading one conveyed object when the leading one conveyed object is taken out.

The present invention has been conceived in consideration of the above problems, and an object thereof is to provide an article supply device and method capable of conveying minute articles and supplying the conveyed minute articles at a high speed.

Solution to Problem

The article supply method of the present invention uses a movable block capable of a reciprocal movement between a first position and a second position. Moreover, the method comprises: a process of introducing one conveyed object into a housing portion formed on the movable block when the movable block is in the first position; a forward process of pressurizing the movable block from a first position side of a movable area for a predetermined time to push the movable block while vacuum-sucking the movable block from a second position side of the movable area of the movable block, and then continuing the vacuum suction from the second position side to move the movable block to the second position; a process of discharging the conveyed object from the housing portion when the movable block is in the second position; and a return process of vacuum-sucking the movable block from the first position side to move the movable block to the first position.

Preferably, the return process is a process of pressurizing the movable block from the second position side of the movable area for a predetermined time to push the movable block while vacuum-sucking the movable block from the first position side of the movable area of the movable block, and then continuing the vacuum suction from the first position side to move the movable block to the first position.

The article supply device of the present invention has a conveyance portion for conveying conveyed objects; a movable block capable of a reciprocal movement between a first position and a second position in a direction intersecting a conveyance direction of the conveyed objects by the conveyance portion; a first pressurization/depressurization portion provided on an end of the movable area on the first position side of the movable block; and a second pressurization/depressurization portion provided on an end of the movable area on the second position side of the movable block. Moreover, the movable block comprises a housing portion capable of housing one of the conveyed objects, and in the first position, the housing portion communicates with a downstream end of the conveyance portion and is capable of receiving the convened objects. Moreover, for the first pressurization/depressurization portion and the second pressurization/depressurization portion, a pressurizing time or a depressurizing time can be controlled independently.

Preferably, the housing portion has, on its side wall surface or bottom surface, an opening of a vent portion that communicates with the second pressurization/depressurization portion.

The above article supply device may further have a take-out port that enables the conveyed objects in the housing to be taken out when the movable block is in the second position.

Alternatively, the above article supply device may further have a second conveyance path provided on a side opposite to the conveyance portion across the movable block and extending in a one-dimensional direction, and the conveyed objects in the housing portion may be dispensable on an upstream end of the second conveyance path when the movable block is in the second position.

Advantageous Effects of Invention

The article supply method or device of the present invention makes it possible to separate, at a high speed, only the leading one conveyed object from a line of the conveyed objects that have reached the movable block that is in the first position. The conveyed object separated in this manner can be taken out by a pickup nozzle in the second position without interference with the subsequent conveyed object, or introduced to another conveyance path with synchronization.

Furthermore, the article supply method or device of the present invention provides following effects: an effect that, when moving the movable block from the first position to the second position, the movable block can be moved while saving air usage for pressurization by pressurizing the movable block from the first position side to push it only in an initial stage of the movement; and an effect to suppress unwanted vibration of the movable block.

DESCRIPTION OF EMBODIMENTS

An article supply device according to a first embodiment of the present invention and an article supply method using the same will be described with reference to FIG. 1 to FIG. 9. Note that in each diagram, its reduction scale is incorrect and a gap between members and the like are exaggerated for easy description.

Figure 1:
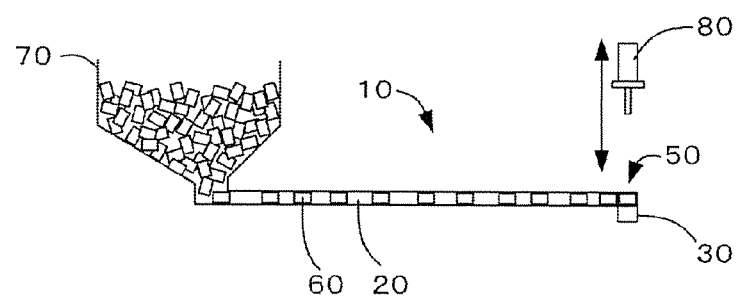
FIG. 1 is a side view illustrating a usage state of an article supply device according to a first embodiment of the present invention.
Figure 2:
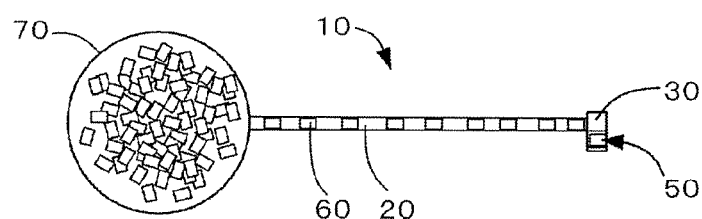
FIG. 2 is a plan view illustrating the usage state of the article supply device according to the first embodiment of the present invention.

In FIG. 1 and FIG. 2, an article supply device 10 of the embodiment is combined with a hopper 70 to convey and supply conveyed objects 60 such as electronic components. The conveyed objects are thrown into the hopper and led from a lower portion of the hopper to a conveyance path 20 that is a conveyance portion of the article supply device 10. The conveyed objects are aligned in line and conveyed to the downstream in the conveyance path by an air flow. The conveyed objects are moved to a take-out port 50 provided on the lateral side of a downstream end of the conveyance path by a movable block 30 provided at the downstream end of the conveyance path, and sucked by a pickup nozzle 80 to be taken out.

The shape and the size of the conveyed objects 60 are not specifically limited. However, when the conveyed objects are large, influence of interference between the conveyed objects becomes relatively small, reducing the significance of using the article supply device of the embodiment. Therefore, when the conveyed objects have a shape such as a long rectangular parallelepiped shape along the conveyance path, the long sides of the conveyed objects are preferably not more than 20 mm, more preferably not more than 5 mm, and particularly preferably not more than 2 mm. In contrast, when the conveyed objects are too small, processing and manufacturing of the device become difficult. Therefore, the long sides of the conveyed objects are preferably not less than 0.05 mm. For the same reason, when the conveyed objects are spherical, the diameters of the conveyed objects are preferably not more than 5 mm, more preferably not more than 2 mm, and particularly preferably less than 1 mm, as well as preferably not less than 10 μm.

Figure 3:
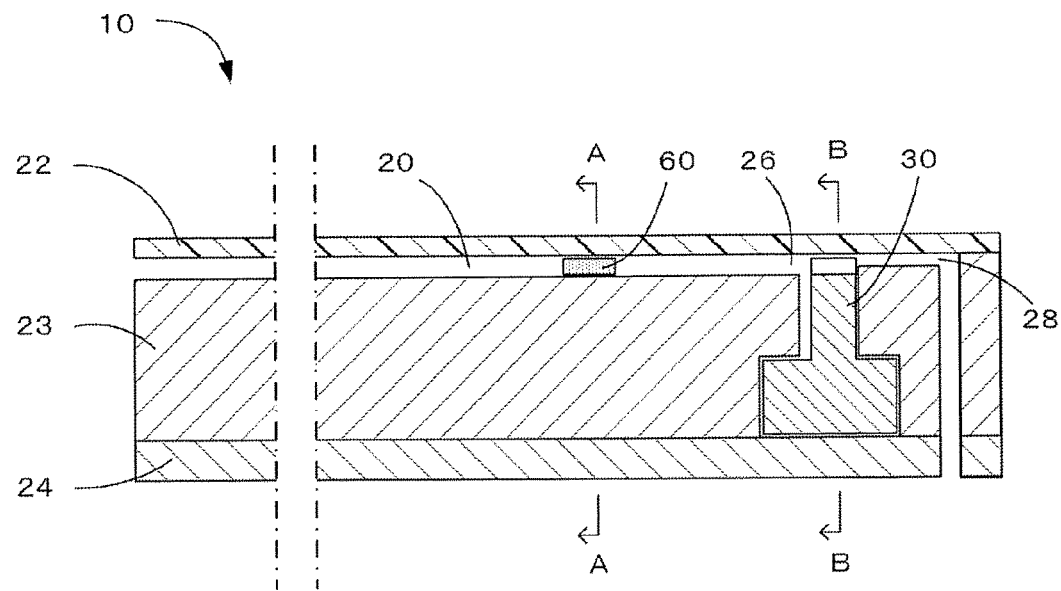
FIG. 3 is a vertical cross-sectional view along a conveyance path of the article supply device according to the first embodiment of the present invention.
Figure 4:
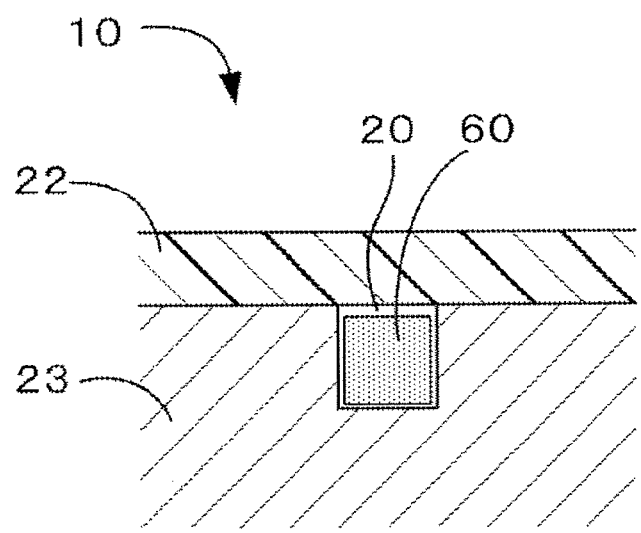
FIG. 4 is a diagram illustrating A-A cross section of FIG. 3.

In FIG. 3 and FIG. 4, the conveyance path 20 is formed in a tunnel shape by a groove formed in a base member 23 and a cover member 22 covering the upper surface of the groove. The cross section of the tunnel is slightly larger than that of the conveyed object 60. To convey minute components at a high speed, it is preferable to form a conveyance path of a closed system in which its side faces and upper and lower surfaces are regulated in this manner.

Air supply portions (27 in FIG. 6) and an air suction portion 28 are respectively provided at the upstream and the downstream of the conveyance path 20. The air supply portions supply air into the conveyance path. The air suction portion sucks the air in the conveyance path. The air suction portion 28 of the embodiment sucks the air in the conveyance path from a downstream end 26 of the conveyance path. The air supply portions and the air suction portion make it possible to generate an air flow that flows from the upstream to the downstream in the conveyance path. Note that, in order to generate the air flow, at least only one of the air supply portions at the conveyance path upstream and the air suction portion at the conveyance path downstream needs to be provided, and in this case, a vent portion needs to be provided as the other one. When the conveyance path is long, an air suction portion and an air supply portion may be appropriately added in midstream of the conveyance path.

Figure 5:
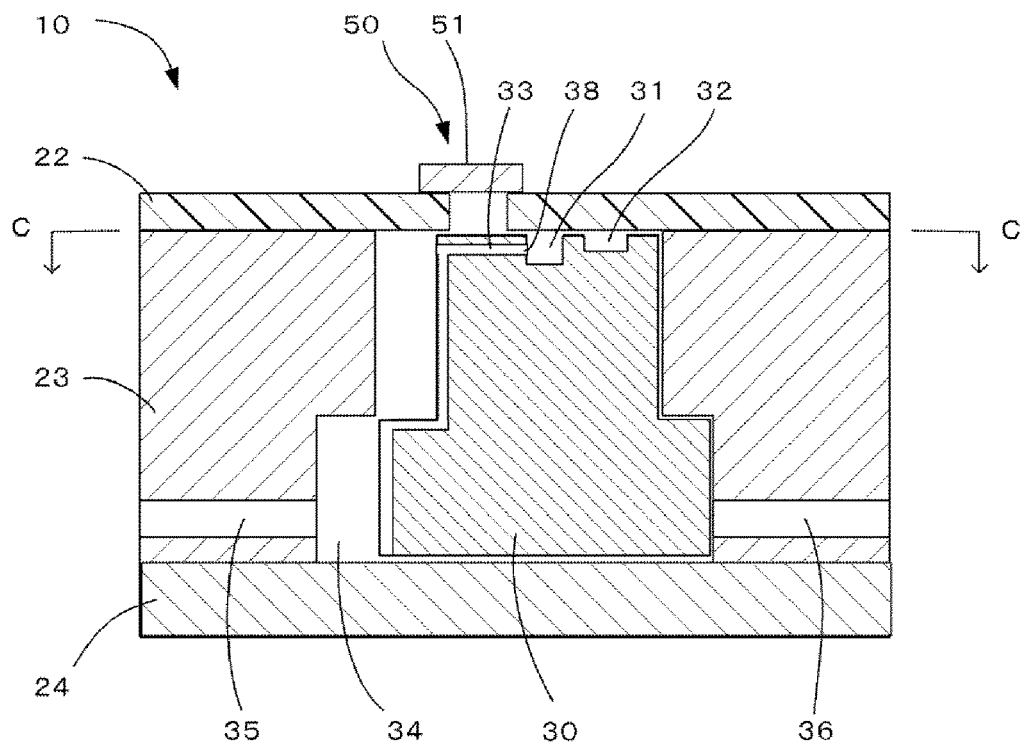
FIG. 5 is a diagram illustrating B-B cross section of FIG. 3.
Figure 6:
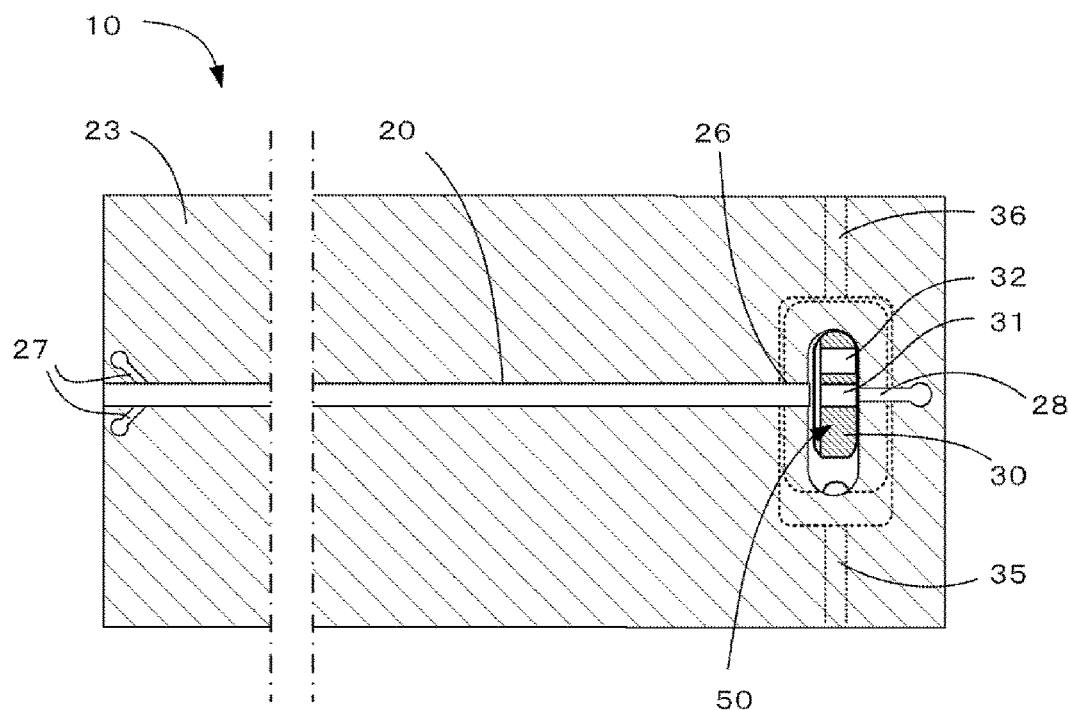
FIG. 6 is a diagram illustrating C-C cross section of FIG. 5.

In FIG. 5 and FIG. 6, the movable block 30 is disposed at the downstream end 26 of the conveyance path 20. The movable block is capable of reciprocally movable in the direction perpendicular to the conveyance path in a horizontal plane (left-right direction in FIG. 5, upper-lower direction in FIG. 6) along a straight line between a first position (right side in FIG. 5, upper side in FIG. 6) and a second position (left side in FIG. 5, lower side in FIG. 6). In this manner, it is preferable that the movable block be reciprocated in a horizontal plane. This is because the movable block can be reciprocated with a smaller driving force. Furthermore, it is preferable that the movable block be reciprocated in the direction perpendicular to the conveyance path, that is, in the direction perpendicular to the receiving direction of the conveyed objects. This is because the movable block can be made smaller with respect to the conveyed objects having the same size.

A movable area 34 of the movable block 30 is defined by a hollow space formed by the base member 23 and a bottom member 24. The movable area 34 is provided with a first pressurization/depressurization portion 36 on an end on a first position side, and a second pressurization/depressurization portion 35 on an end on a second position side. The first pressurization/depressurization portion and the second pressurization/depressurization portion supply air into the movable area for pressurization or suck air from the movable area for depressurization, so as to generate a pressure difference between both sides of the movable block, thereby operate the movable block. For the first pressurization/depressurization portion and second pressurization/depressurization portion, a pressurizing time or a depressurizing time can be controlled independently.

Figure 7:
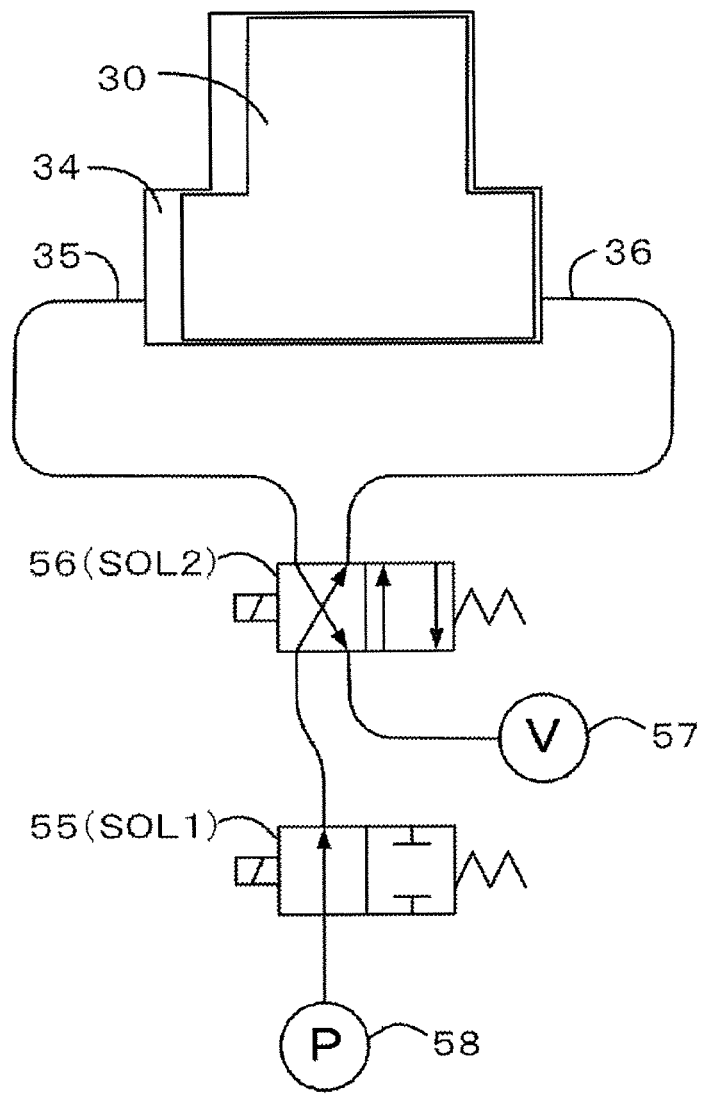
FIG. 7 shows a control unit of a first pressurization/depressurization portion and a second pressurization/depressurization portion of the article supply device according to the first embodiment of the present invention.

FIG. 7 illustrates a configuration of a control unit of the first pressurization/depressurization portion 36 and the second pressurization/depressurization portion 35. The control unit has two solenoid valves 55, 56, a vacuum source 57 such as a vacuum pump, and a pressure source 58 such as an air tank or a compressor.

The passage of the solenoid valve SOL2 (56) becomes an intersecting state shown in a left square by electromagnetic force during magnetizing (ON), and becomes a parallel state shown in a right square by a spring during demagnetizing (OFF). The passage of the solenoid valve SOL1 (55) becomes a valve opening state shown in a left square during magnetizing (ON), and becomes a valve closing state shown in a right square during demagnetizing (OFF). In FIG. 7, both of the two solenoid valves are in an ON state. When the solenoid valve SOL2 is ON, the second pressurization/depressurization portion 35 communicates with the vacuum source 57 and vacuum-sucks the movable block 30 from the second position side. At this time, the first pressurization/depressurization portion 36, depending on the state of the solenoid valve SOL1, is closed when the solenoid valve SOL1 is OFF, and communicates with the pressure source 58 only when the solenoid valve SOL1 is ON, so as to pressurize the movable block from the first position side to push it. When the solenoid valve SOL2 is OFF, the first pressurization/depressurization portion 36 communicates with the vacuum source 57 and vacuum-sucks the movable block from the first position side. At this time, the second pressurization/depressurization portion 35, depending on the state of the solenoid valve SOL1, is closed when the solenoid valve SOL1 is OFF, and communicates with the pressure source 58 only when the solenoid valve SOL1 is ON, so as to pressurize the movable block from the second position side to push it.

Returning to FIG. 5 and FIG. 6, the movable block 30 has, at an upper surface, a housing portion 31 having a groove shape capable of housing one conveyed object. The housing portion 31 is a housing portion of a closed system in which its both side faces and its upper and lower surfaces are regulated, making it possible to stably move the conveyed object while preventing the conveyed object in the housing portion from jumping out of the housing portion even when the movable block is driven at a high speed in the state where the conveyed object is housed in the housing portion 31.

When the movable block 30 is in the first position that is one end in the reciprocal movement, the housing portion 31 serves as an extension of the conveyance path 20, making it possible to receive one conveyed object that has reached the downstream end 26 of the conveyance path.

When the movable block 30 is in the second position that is the other end of the reciprocal movement, the conveyed object can be taken out using a pickup nozzle by opening a shatter 51 of a take-out port 50 provided above the housing portion 31. Note that the shatter is not necessarily needed, and the take-out port may be always opened.

In the upper surface of the movable block 30, a vent portion 32 for conveyance having a groove shape shallower than the housing portion is formed on the first position side of the housing portion 31. The vent portion for conveyance only needs to have the shape that makes the downstream end 26 of the conveyance path communicate with the air suction portion 28 when the movable block is in the second position and that enables the conveyed objects that have reached the downstream end 26 of the conveyance path to be dammed.

In addition, the movable block 30 has a vent portion 33 for fixation that communicates with the second pressurization/depressurization portion 35, and its opening 38 is provided on the side wall of the housing portion. Note that the opening 38 may be provided on the bottom surface of the housing portion. As a result, when the second pressurization/depressurization portion vacuum-sucks the movable block from the second position side, the conveyed object in the housing portion is fixed (positioned) in the opening 38.

Next, operation of the movable block of the embodiment will be described with reference to FIGS. 8A to 8F and FIG. 9. FIGS. 8A to 8F illustrate the positional change of the movable block, and FIG. 9 illustrates the operating state of the first and second pressurization/depressurization portions. Indications of A to F in FIG. 9 correspond to the conditions in FIGS. 8A to 8F, respectively. Indications of SOL1 and SOL2 in FIG. 9 shows the states of the solenoid valves SOL1 (55) and SOL2 (56) in FIG. 7.

Figure 8A:
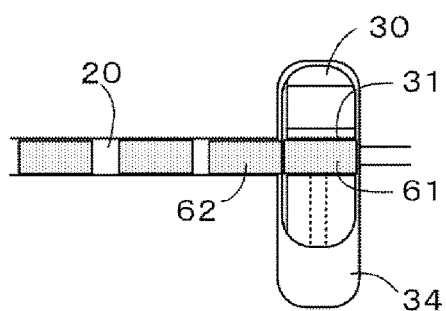
FIGS. 8A to 8F are diagrams for explaining an operation of the movable block in the first embodiment of the present invention.
Figure 9:
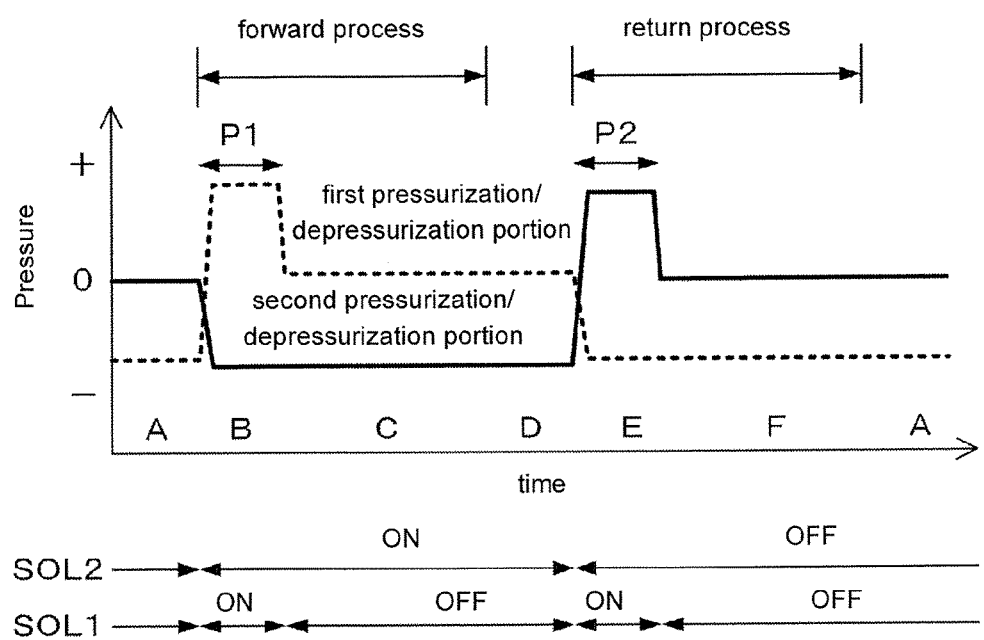
FIG. 9 is a diagram for explaining a method of controlling the first pressurization/depressurization portion and the second pressurization/depressurization portion in the first embodiment of the present invention.

In FIG. 8A, the movable block 30 is in the first position. The conveyed objects are conveyed by an air flow to reach the downstream end of the conveyance path 20, and the leading conveyed object 61 is introduced in the housing portion 31 of the movable block. At this time, referring to FIG. 9, the first pressurization/depressurization portion performs vacuum suction so that the movable block does not move. On the other hand, the second pressurization/depressurization portion does not operate, that is, it performs neither pressurization nor depressurization.

Figure 8B:
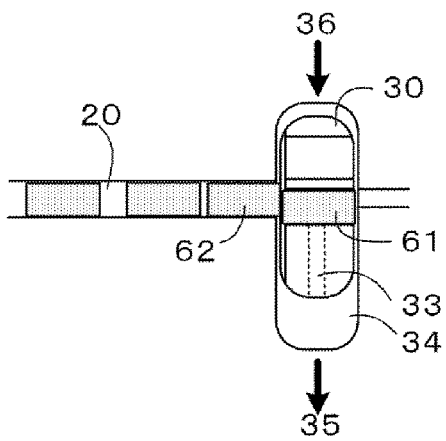

Next, in FIG. 8B, while the second pressurization/depressurization portion 35 sucks the air in the movable area 34 so as to vacuum-suck the movable block from the second position side, the first pressurization/depressurization portion 36 supplies air into the movable area for a predetermined time for pressurization so as to push the movable block from the first position side. As a result, the movable block starts moving toward the second position.

Figure 8C:
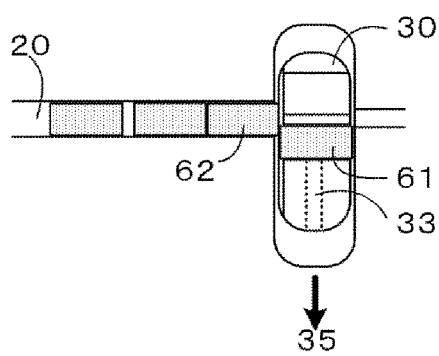

Next, in FIG. 8C, air supply by the first pressurization/depressurization portion is stopped, while air suction by the second pressurization/depressurization portion 35 is continued. The movable block continues to move toward the second position by the vacuum suction by the second pressurization/depressurization portion. A process of moving the movable block from the first position to the second position in the above FIG. 8B and FIG. 8C is a forward process.

Figure 8D:
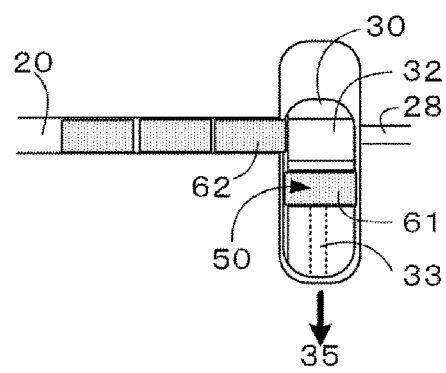

Next, in FIG. 8D, the movable block 30 reaches the second position. The second pressurization/depressurization portion 35 continues vacuum suction so that the movable block does not move. While the vacuum suction by the second pressurization/depressurization portion is performed in FIGS. 8B to 8D, the conveyed object 61 in the housing portion is sucked to and positioned on the opening of the vent portion 33 for fixation. The shatter (51 in FIG. 5) on the upper portion of the take-out port 50 is opened and the conveyed object 61 is taken out by the pickup nozzle. On the other hand, the conveyance path 20 is communicated with the air suction portion 28 via the vent portion 32 for conveyance, so that the conveyed objects on the conveyance path continue to move toward the downstream, and the subsequent conveyed objects 62 are dammed by the movable block to form a line.

Figure 8E:
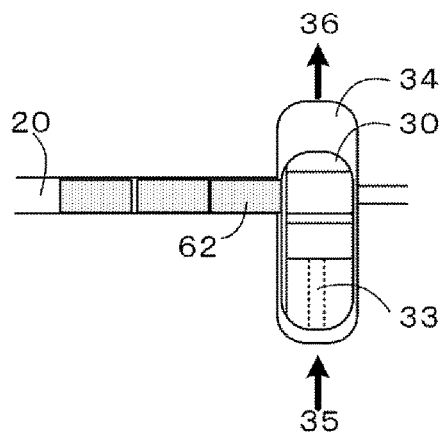

Next, in FIG. 8E, while the first pressurization/depressurization portion 36 sucks the air in the movable area 34 so as to vacuum-suck the movable block from the first position side, the second pressurization/depressurization portion 35 supplies air into the movable area for a predetermined time for pressurization so as to push the movable block from the second position side.

Figure 8F:
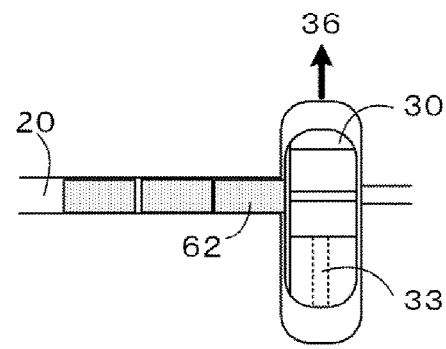

Next, in FIG. 8F, air supply by the second pressurization/depressurization portion is stopped, while air suction by the first pressurization/depressurization portion 36 is continued. The movable block continues to move toward the first position by vacuum suction by the first pressurization/depressurization portion. A process of moving the movable block from the second position to the first position in the above FIG. 8E and FIG. 8F is a return process.

Then, the movable block reaches the first position and returns to the state in FIG. 8A. Repeating the above operation to sequentially separate only the leading one conveyed object (one by one) and move to the take-out port from the line of the conveyed objects that have reached the downstream end of the conveyance path makes it possible to supply the conveyed object to the pickup nozzle one by one. The cycle of the reciprocal movement of the movable block is typically 20 to 30 ms.

In the forward process, the first pressurization/depressurization portion is controlled independently from the second pressurization/depressurization portion so that the first pressurization/depressurization portion performs pressurization only in an initial stage of the movement of the movable block. The time in which the first pressurization/depressurization portion performs pressurization (P1 in FIG. 9) may be very short, however the lower limit is actually defined by the response time of the solenoid valve SOL1 in FIG. 7. Since the response times of commercially available solenoid valves are about 1.5 ms, the pressurizing time P1 with the first pressurization/depressurization portion is preferably not less than 1.5 ms. Furthermore, in view of time to stabilize pressure in piping or the movable area, the pressurizing time P1 is preferably not less than 2 ms. On the other hand, when the pressurizing time P1 is too long, the effect obtained by limiting the pressurization in the initial stage of the movement is lowered. Therefore, the pressurizing time P1 is preferably not more than a half of the forward process of the movable block. For example, when the required time for the forward process is 10 ms, the pressurizing time P1 is preferably not more than 5 ms.

Hereinafter, effects of the article supply method and the article supply device of the embodiment will be described.

In the embodiment, as illustrated in FIGS. 8A to 8F, the leading one conveyed object 61 among conveyed objects forming a line at the downstream end of the conveyance path is separated and moved to the take-out port by the movable block, preventing the leading one conveyed object 61 from interfering with the subsequent conveyed object 62 upon taking out the leading one conveyed object 61. This makes it difficult to cause failures even when taking out pitch is made short, and makes it possible to increase the number of conveyed objects to be supplied per unit time.

An effect obtained by pressurizing the movable block to push it by the first pressurization/depressurization portion only in the initial stage of the movement while vacuum-sucking the movable block by the second pressurization/depressurization portion in the forward process is as follows. Since resistance to the movement is large when the movable block starts to move, performing pressurization by the first pressurization/depressurization portion enables to ensure that the movable block starts to move, as compared to the case where only the vacuum suction by the second pressurization/depressurization portion is performed. In addition, since air usage amount can be saved as compared to the case where the pressurization is performed throughout the forward process, it is advantageous in regards to energy costs. Furthermore, it is possible to suppress unwanted vibration of the movable block. The air supplied into the movable area by the first pressurization/depressurization portion is to exit outside though surrounding gaps and the like, and the air flow easily vibrate the movable block. This unwanted vibration adversely affects the position accuracy and the success rate of picking up when taking out conveyed objects, and also adversely affects the component life of the device.

Note that, in the return process, too, like the forward process, it is preferable to perform pressurization by the second pressurization/depressurization portion only in the initial stage of the movement of the movable block. However, since the housing portion contains no conveyed objects in the return process, the movable block is lighter than in the forward process and resistance at the start of moving is small. Therefore, the movable block can be started to move only by the vacuum suction by the first pressurization/depressurization portion in many cases. Similarly to the forward process, air usage amount can be saved and unwanted vibration of the movable block can be suppressed as compared to the case where the pressurization is performed throughout the return process. The preferable range of the pressurizing time (P2 in FIG. 9) with the second pressurization/depressurization portion is also similar to the pressurizing time P1 with the first pressurization/depressurization portion in the forward process.

In the embodiment, the conveyed object is positioned in the housing portion of the movable block by the action of the vent portion 33 for fixation. Therefore, the conveyed object does not rattle when the movable block moves. In addition, the housing portion is formed a little larger than the conveyed object, but positioning the conveyed object increases the position accuracy and the success rate of picking up. This is particularly beneficial when the conveyed object is small. Furthermore, since both of the movement of the movable block to the second position and the positioning of the conveyed object are realized by suction with the second pressurization/depressurization portion, synchronous control of both of them becomes unnecessary, and therefore, it is possible to perform a series of operation in a stable manner if the taking out pitch is made short.

Next, an article supply device that is a second embodiment of the present invention will be described with reference to FIG. 10. A configuration of a control unit of the first pressurization/depressurization portion and the second pressurization/depressurization portion in this embodiment is different from that in the first embodiment.

Figure 10:
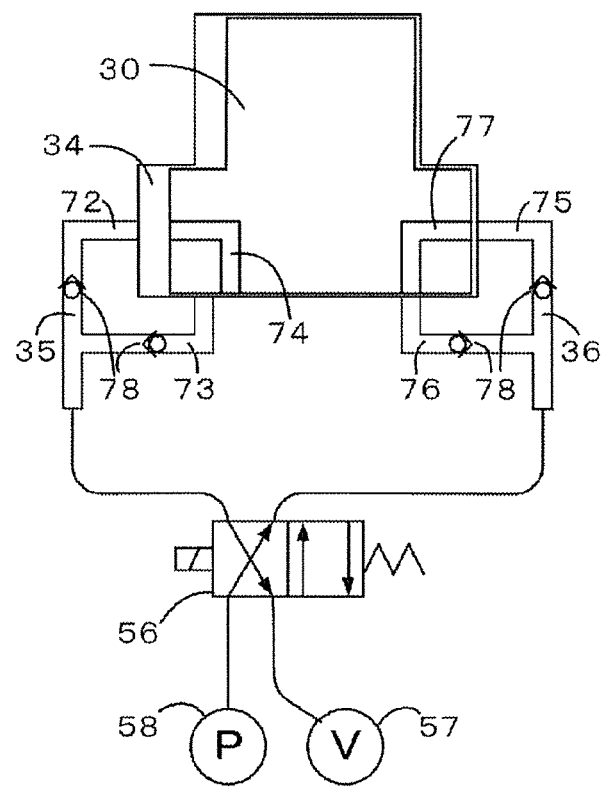
FIG. 10 shows a configuration of a control unit of a first pressurization/depressurization portion and a second pressurization/depressurization portion of an article supply device according to a second embodiment of the present invention.

FIG. 10 illustrates a configuration of a control unit of the first pressurization/depressurization portion 36 and the second pressurization/depressurization portion 35. The control unit has one solenoid valve 56, a vacuum source 57 such as a vacuum pump, and a pressure source 58 such as an air tank or a compressor. The first pressurization/depressurization portion 36 has a vent passage 75 for depressurization and a vent passage 76 for pressurization, and the second pressurization/depressurization portion 35 has a vent passage 72 for depressurization and a vent passage 73 for pressurization. Each of the vent passages is provided with a check valve 78, so that air flows only in a direction from a movable area 34 to the solenoid valve 56 in the vent passages 75, 72 for depressurization, while air flows only in a direction from the solenoid valve 56 to the movable area 34 in the vent passages 76, 73 for pressurization. Furthermore, vent passages 77, 74 are formed in the movable block 30, so that the vent passage 77 in the movable block on a first position side communicates with the vent passage 76 for pressurization of the first pressurization/depressurization portion when the movable block is in a first position (a state in FIG. 10), and that the vent passage 74 in the movable block on a second position side communicates with the vent passage 73 for pressurization of the second pressurization/depressurization portion when the movable block is in a second position.

In the forward process of moving the movable block 30 from the first position to the second position, the solenoid valve 56 is set to an intersecting state shown in a left square. The vacuum source 57 communicates with the second pressurization/depressurization portion 35, and vacuum-sucks the movable block from the second position side through vent passage 72 for depressurization. At this time, the vacuum source 58 communicates with the first pressurization/depressurization portion 36, and pressurizes the movable block from the first position side to push it through the vent passage 76 for pressurization and the vent passage 77 in the movable block. When the movable block starts to move and the position of the connecting part of the vent passage 76 for pressurization and the vent passage 77 in the movable block shifts, the pressurization by the first pressurization/depressurization portion stops. Afterward, the movable block continues to move by the vacuum suction by the second pressurization/depressurization portion. In this way, the pressurization time with the first pressurization/depressurization portion is autonomously determined by the movement of the movable block.

A return process of moving the movable block 30 from the second position to the first position also has the similar operation.

The present invention is not limited to the above embodiments, and various modifications can be made within the scope of its technical idea.

For example, the conveyance portion is not limited to those consisting of one conveyance path, a plurality of conveyance paths may be provided in parallel. In that case, the movable block only has to be provided with the same number of housing portions as the number of the conveyance paths to receive the conveyed objects one by one from each of the conveyance paths.

In addition, for example, the conveyance portion may be composed of a vibration feeder instead of the conveyance path extending in a one-dimensional direction.

In addition, for example, it may also be configured that the conveyed objects are dispensed into yet another conveyance path when the movable block is in the second position, instead of taking out the conveyed objects from the movable block that has moved to the second position.

Figure 11:
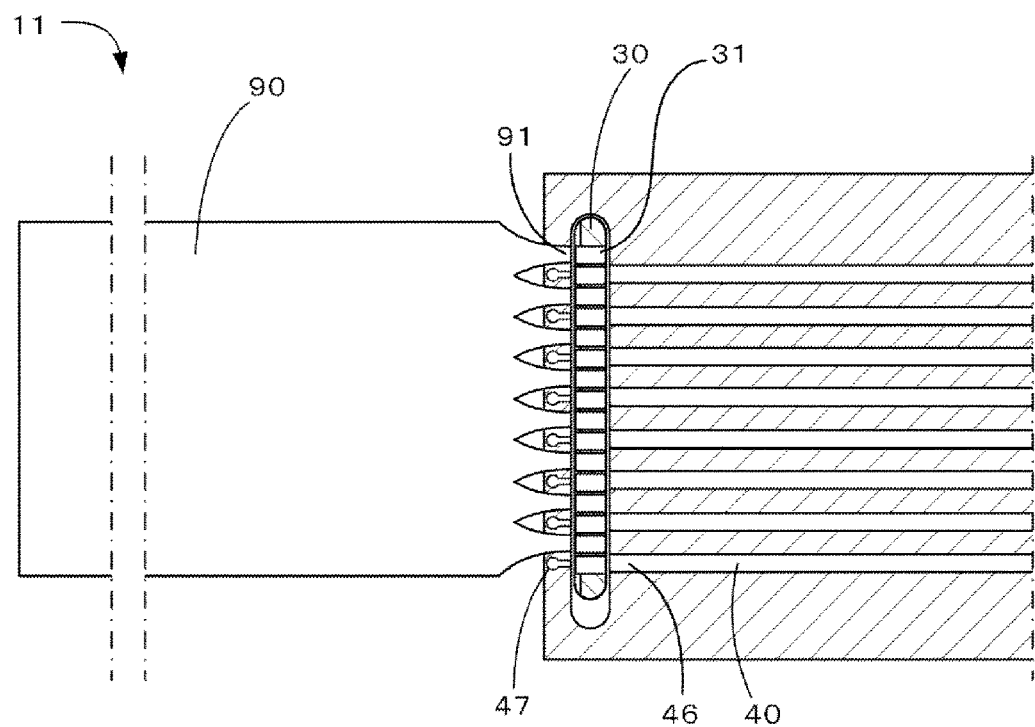
FIG. 11 is a plan view (left side) and a horizontal cross-sectional view (right side) along second conveyance paths of an article supply device according to another embodiment of the present invention.

FIG. 11 illustrates a variation of the article supply device. In FIG. 11, the article supply device 11 has a vibration feeder 90 as a conveyance portion, and a plurality of second conveyance paths extending in a one-dimensional direction are disposed in parallel on a side opposite to the vibration feeder across the movable block 30. The conveyed objects are thrown onto the vibration feeder 90, and then conveyed toward the movable block. In the first position, each of the plurality of housing portions 31 of the movable block 30 receives one conveyed object from outlet ports 91 of the vibration feeder. In the second position, each of the housing portions of the movable block communicates with an upstream end 46 of the second conveyance path 40, and the conveyed object is dispensed into the second conveyance path by an air flow generated by an air supply portion 47.

The invention claimed is:

1. An article supply method using a movable block capable of a reciprocal movement between a first position and a second position, comprising:
    introducing one conveyed object into a housing portion formed on the movable block when the movable block is in the first position;
    moving the movable block from the first position to the second position by pressurizing the movable block from a first position side of a movable area for a predetermined time to push the movable block while vacuum-sucking the movable block from a second position side of the movable area of the movable block, and then continuing the vacuum suction from the second position side;
    discharging the conveyed object from the housing portion when the movable block is in the second position; and
    returning the movable block from the second position to the first position by vacuum-sucking the movable block from the first position side to move the movable block to the first position.

2. The article supply method according to claim 1, wherein
    the returning of the movable block from the second position to the first position is conducted by pressurizing the movable block from the second position side of the movable area for a predetermined time to push the movable block while vacuum-sucking the movable block from the first position side of the movable area of the movable block, and then continuing the vacuum suction from the first position side.

3. An article supply device, comprising:
    a conveyance portion for conveying conveyed objects;
    a movable block capable of a reciprocal movement between a first position and a second position in a direction intersecting a conveyance direction of the conveyed objects by the conveyance portion;
    a first pressurization/depressurization portion provided on an end of a movable area on the first position side of the movable block; and
    a second pressurization/depressurization portion provided on an end of the movable area on the second position side of the movable block, wherein:
    the movable block comprises a housing portion capable of housing one of the conveyed objects;
    in the first position, the housing portion communicates with a downstream end of the conveyance portion and is capable of receiving the conveyed objects; and
    for the first pressurization/depressurization portion and the second pressurization/depressurization portion, a pressurizing time or a depressurizing time can be controlled independently.

4. The article supply device according to claim 3, wherein the housing portion has, on its side wall surface or bottom surface, an opening of a vent portion that communicates with the second pressurization/depressurization portion.

5. The article supply device according to claim 3, further comprising a take-out port that enables the conveyed objects in the housing to be taken out when the movable block is in the second position.

6. The article supply device according to claim 3, further comprising a second conveyance path provided on a side opposite to the conveyance portion across the movable block and extending in a one-dimensional direction, wherein the conveyed objects in the housing portion are dispensable on an upstream end of the second conveyance path when the movable block is in the second position.

7. The article supply device according to claim 4, further comprising a take-out port that enables the conveyed objects in the housing to be taken out when the movable block is in the second position.

8. The article supply device according to claim 4, further comprising a second conveyance path provided on a side opposite to the conveyance portion across the movable block and extending in a one-dimensional direction, wherein
the conveyed objects in the housing portion are dispensable on an upstream end of the second conveyance path when the movable block is in the second position.

\* \* \* \* \*